United States Patent [19]

Peterson et al.

[11] Patent Number: 4,749,879
[45] Date of Patent: Jun. 7, 1988

[54] SIGNAL TRANSITION DETECTION METHOD AND SYSTEM

[75] Inventors: Donald S. Peterson, Philomath; Andrew P. Taussig, Eugene, both of Oreg.

[73] Assignee: Spectra-Physics, Inc., San Jose, Calif.

[21] Appl. No.: 63,538

[22] Filed: Jun. 18, 1987

[51] Int. Cl.[4] .................... H03K 5/08; H03K 5/153
[52] U.S. Cl. .................... 307/354; 235/436; 235/462; 250/568; 307/518; 307/358; 328/164
[58] Field of Search .............. 307/231, 517, 518, 354, 307/236, 261, 311, 358; 328/164, 114, 118, 132; 235/436, 462; 250/566, 568

[56] References Cited

U.S. PATENT DOCUMENTS

| 3,892,949 | 7/1975 | Dodson, III | 235/462 |
| 4,000,397 | 12/1976 | Hebert et al. | 235/462 |
| 4,131,857 | 12/1978 | Clymer | 328/164 |
| 4,697,098 | 9/1987 | Cloke | 307/354 |

Primary Examiner—John Zazworsky
Attorney, Agent, or Firm—Killworth, Gottman, Hagan & Schaeff

[57] ABSTRACT

A system and method are provided for determining the occurrence of transitions in a binary encoded analog input signal. The system includes a threshold circuit, responsive to the input signal, for generating first and second grating signals in dependence upon whether the input signal exceeds or is less than a first threshold level, respectively. A first circuit means, responsive to the input signal, differentiates the input signal to form a first derivative signal. A threshold circuit, responsive to the first derivative signal, generates third and fourth gating signals in dependence upon whether the first derivative signal exceeds a second threshold level or is less than a third threshold level, respectively. A second circuit means, responsive to the first derivative signal, differentiates the first derivative signal to form a second derivative signal. The second derivative signal has zero crossings which are detected by a zero crossing means, responsive to the second derivative signal and to the first, second, third and fourth gating signals.

20 Claims, 3 Drawing Sheets

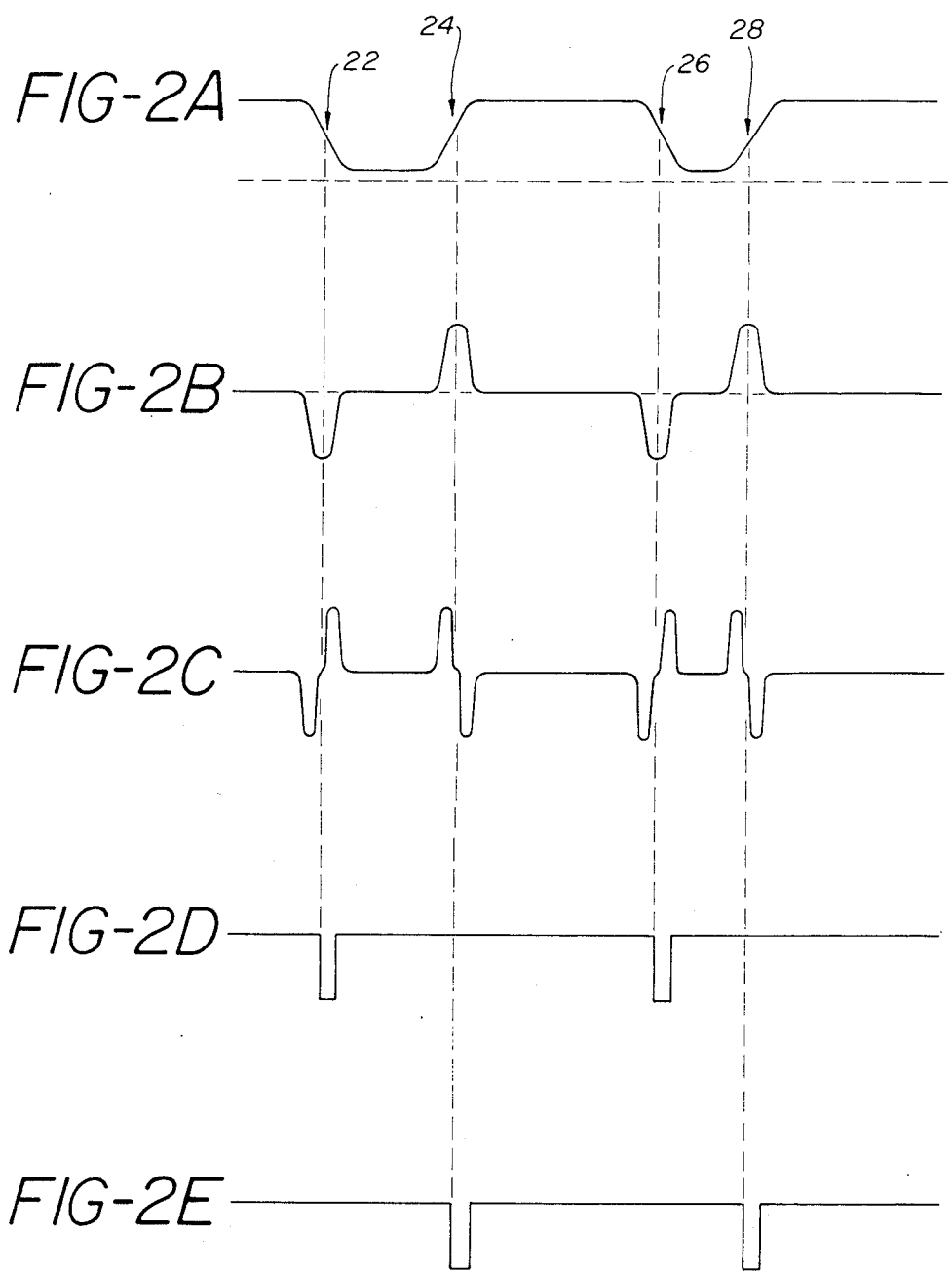

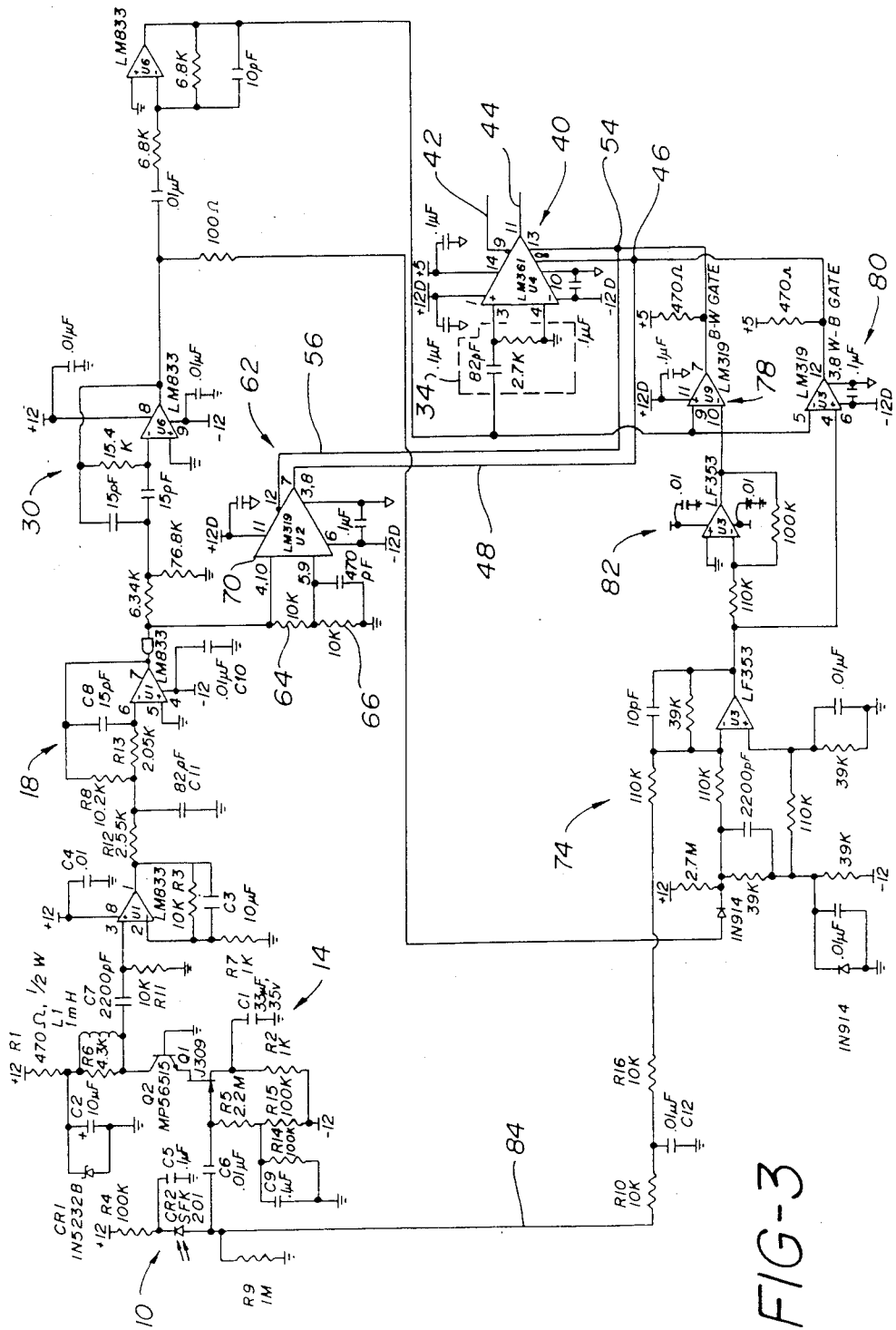

SIGNAL TRANSITION DETECTION METHOD AND SYSTEM

BACKGROUND OF THE INVENTION

The present invention relates to a system for processing electrical signals and, more particularly, to a system for detecting the transitions between binary level signals of the type produced by a bar code scanner.

Electrical signals having transitions between binary levels are generated by many different devices, including electro-optical scanners of the type which scan bar code symbols and produce a corresponding video digital signal. Bar code symbols, such as those used in the Universal Product Code (UPC), are generally characterized as a series of parallel light and dark rectangular areas of different widths, consisting of dark bars and light intervening spaces. The various symbols are made up of different combinations and orderings of these light and dark rectangular areas.

Electro-optical scanning apparatus scans these bar code symbols on labels by detecting light which is reflected therefrom. The reflected light is incident upon a photo-multiplier tube, or other optical detector, which generates an electrical signal having one level for dark bars and a second level for light spaces. Positive-going transitions and negative-going transitions occur in the electrical signal to signify transitions between the light and dark rectangular areas of the scanned symbols. The transitions in the electrical signals are not perfectly sharp but, rather, occur over finite periods of time, thus making it difficult to determine the exact instant at which these transitions occur. Additionally, the labels may become slightly discolored for a variety of reasons, or may be printed on a colored background, or may be poorly printed with inadvertent spots and voids, thus introducing unexpected variations in the electrical signal produced during scanning. As a consequence, it is necessary to process the electrical signals in order to assess accurately the timing of these transitions and the corresponding widths of the light and dark rectangular areas making up the symbols.

Various circuits are known for carrying out such signal processing. These signal processing circuits typically include filters for removing unwanted components, and may also include threshold circuits in an attempt to reject spurious transitions. One prior art signal processing circuit is disclosed and claimed in U.S. Pat. No. 4,000,397, issued Dec. 28, 1976, to Hebert et al, and assigned to the assignee of the present invention. The Hebert et al circuit detects the zero crossings of the second derivative of the binary signal at selected gating times. These selected gating times occur whenever the first derivative of the binary signal exceeds a threshold level. The threshold level may be determined by adding the peak-to-peak levels of the binary signal to a rectified noise measurement signal.

Although many such signal processing circuits have been used successfully, a need continues to exist for an improved signal processing system which allows for greater precision in the detection of the transitions of a binary signal.

SUMMARY OF THE INVENTION

This need is met by the method and system of the present invention. The method for determining the occurrence of transitions in a binary encoded analog input signal, comprises the steps of: generating first and second gating signals in dependence upon whether the input signal exceeds or is less than a first threshold level, respectively; differentiating the input signal to form a first derivative signal; generating third and fourth gating signals in dependence upon whether the first derivative signal exceeds a second threshold level or is less than a third threshold level, respectively; differentiating the first derivative signal to form a second derivative signal, the second derivative signal having zero crossings; and detecting the zero crossings during the simultaneous generation of the first and third gating signals and during the simultaneous generation of the second and fourth gating signals, thereby determining transitions in the input signal.

The step of generating first and second gating signals may include the step of adjusting the first threshold level in dependence upon the level of the analog input signal over a period of time.

The step of detecting the zero crossings may include the step of gating the second derivative signal through a zero crossing detector circuit upon the simultaneous occurrence of the first and third gating signals or upon the simultaneous occurrence of the second and fourth gating signals. The first, second, and third threshold levels are preferably D.C. threshold levels, with the second and third threshold levels being of opposite polarity. The second and third threshold levels are adjusted in dependence upon the level of the input signal over a period of time. The second and third threshold levels are also adjusted in dependence upon the level of the first derivative signal over a period of time.

The method may further comprise the steps of amplifying the input signal prior to differentiating the input signal, and filtering the input signal after it is amplified. The zero crossings of the second derivative signal during the simultaneous generation of the first and third gating signals indicate low to high transition of the input signal, and zero crossings of the second derivative signal during the simultaneous generation of the second and fourth gating signals indicate high to low transitions of the input signal.

A system, according to the present invention, for determining the occurrence of transitions in a binary encoded analog input signal, comprises: first threshold means, responsive to the input signal, for generating first and second gating signals in dependence upon whether the input signals exceeds or is less than a first threshold level, respectively; first circuit means, responsive to the input signal, for differentiating the input signal to form a first derivative signal; second threshold means, responsive to the first derivative signal, for generating third and fourth gating signals in dependence upon whether the first derivative signal exceeds a second threshold level or is less than a third threshold level, respectively; second circuit means, responsive to the first derivative signal, for differentiating the first derivative signal to form a second derivative signal, the second derivative signal having zero crossings; and zero crossing means, responsive to the second derivative signal and to the first, second, third and fourth gating signals, for detecting the zero crossings of the second derivative signal during the simultaneous receipt of the first and third gating signals and during the simultaneous receipt of the second and fourth gating signals, thereby determining transitions in the input signal.

The first threshold means may include means for adjusting the first threshold level in dependence upon the level of the analog input signal over a period of time. The zero crossing means may include a zero crossing detector circuit, a first coincidence gate for enabling the detector circuit upon the simultaneous occurrence of the first and third gating signals, and a second coincidence gate for enabling the detector circuit upon the simultaneous occurrence of the second and fourth gating signals.

The first, second, and third threshold levels are preferably D.C. threshold levels, with the second and third threshold levels being of opposite polarity. The second threshold means is responsive to the input signal such that the second and third threshold levels are adjusted in dependence upon the level of the input signal over a period of time. The second threshold means is also responsive to the first derivative signal such that the second and third threshold levels are adjusted in dependence upon the level of the first derivative signal over a period of time.

The system may further comprise a preamplifier means for amplifying the input signal, and a low pass filter means, responsive to the preamplifier means, for filtering the input signal after the input signal is amplified and before the input signal is differentiated. The zero crossings of the second derivative signal during the simultaneous generation of the first and third gating signals indicate low to high transitions of the input signal, and the zero crossings of the second derivative signal during the simultaneous generation of the second and fourth gating signals indicate high to low transitions of the input signal.

Accordingly, it is an object of the present invention to provide a method and apparatus for determining the occurrence of transitions in a binary encoded analog input signal in which zero crossings of the second derivative of the input signal are detected; to provide such a method and apparatus in which only those zero crossings which occur when the level of the input signal is appropriate for the direction of transitions are recognized; and to provide such a method and apparatus in which only those zero crossings of the second derivative are recognized which occur when the level of the first derivative of the input signal is appropriate.

Other objects and advantages of the invention will be apparent from the following description, the accompanying drawings and the appended claims.

BRIEF DESCRIPTION OF THE DRAWINGS

FIGS. 2A-2E are timing and waveshape diagrams useful in explaining the present invention; and FIG. 3 is a more detailed electrical schematic diagram of the present invention.

DETAILED DESCRIPTION OF THE PREFERRED EMBODIMENT

Figure 1:
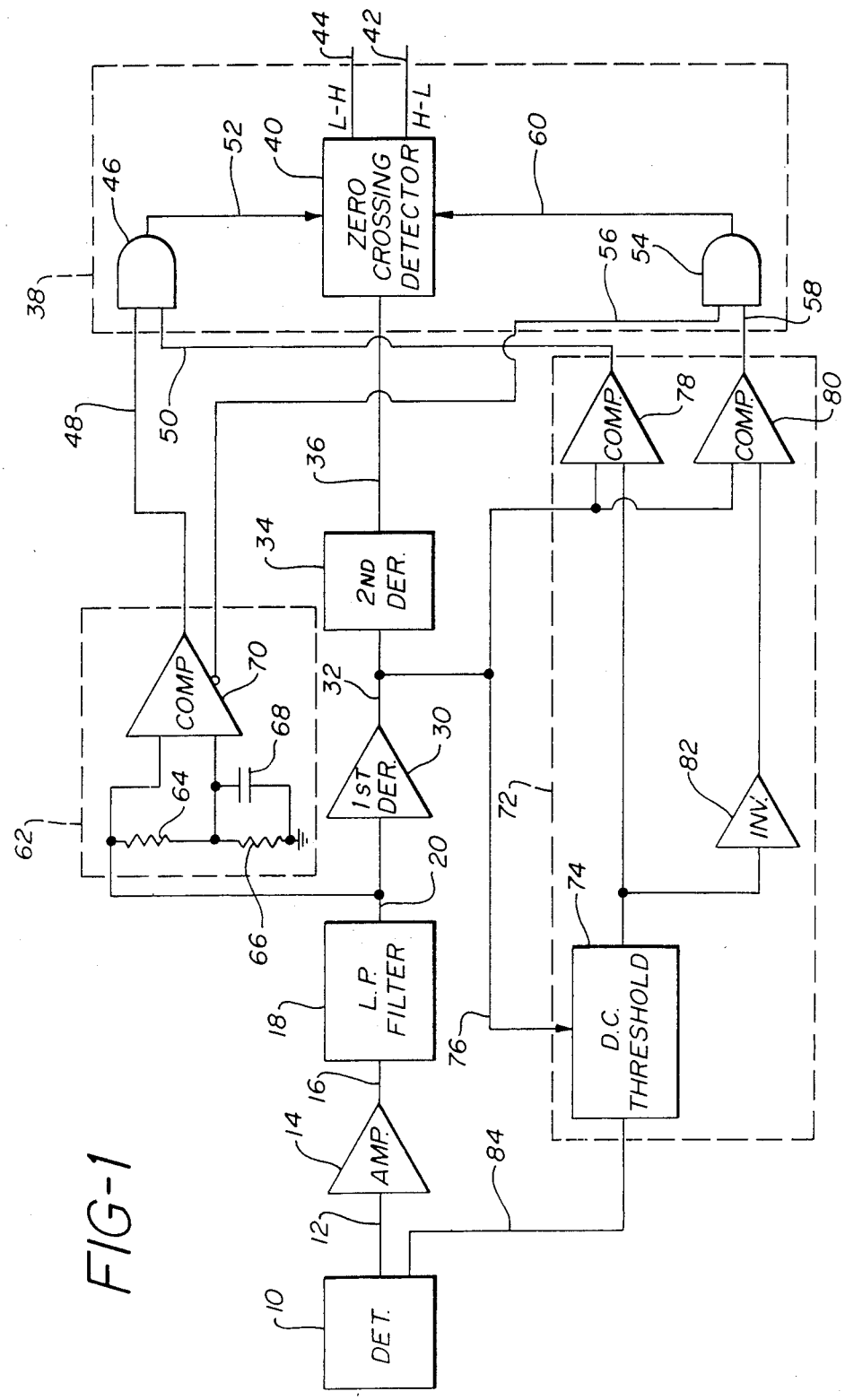
FIG. 1 is a schematic diagram of a system according to the present invention for determining the occurrence of transitions in a binary encoded analog input signal.

Reference is made to FIGS. 1 and 2 of the drawings which illustrate the system according to the present invention for determining the occurrence of transitions in a binary encoded analog input signal. Such a signal may, for example be provided by a detector 10 in a bar code scanning system which sequentially receives reflected light from a series of bar code symbols. In a bar code scanning system, a beam of light is swept across the bars making up the symbols and the intensity of the reflected light is determined to permit an assessment of their width and spacing. The detector 10 provides a higher level input signal on line 12 when light is reflected from the spaces between bars than when light is reflected from the bars themselves. By identifying the level transitions in the input signal on line 12, the width and spacing of the bars may be determined.

The difficulty encountered is that the changes in the level of the input signal do not occur as step functions; rather, these changes occur over finite periods of time. Additionally, small spots in the spaces between bars or small voids in the bars may be present, increasing the difficulties encountered in identifying true transitions. The system of the present invention is able to distinguish between such aberrations in the input signal and true transitions.

The input signal on line 12 is supplied to a preamplifier means, consisting of preamplifier 14, where it is amplified sufficiently for further processing. Next, the amplified input signal is supplied on line 16 to a low pass filter means consisting of low pass filter 18 where high frequency components which may have been produced by various noise sources are eliminated. A signal typical of the output of filter 18 on line 20 is shown in FIG. 2A. The balance of the circuitry identifies the transition points, designated generally at 22, 24, 26, and 28, in the input signal.

The input signal is supplied on line 20 to a first circuit means, including derivative circuit 30, which differentiates the input signal and provides a first derivative signal to line 32 as illustrated in FIG. 2B. Next, the first derivative signal on line 32 is supplied to a second circuit means, including derivative circuit 34, which differentiates the first derivative signal and provides a second derivative signal on line 36, as depicted in FIG. 2C. The circuit of the present invention determines the transition points of the input signal by detecting the zero crossing points of this second derivative signal.

A zero crossing means 38, including a zero crossing detector circuit 40, detects when the second derivative signal on line 36 makes a zero crossing. If the zero crossing is one in which the transition of the input signal is from high to low, circuit 40 provides a short negative going pulse on line 42, as illustrated in FIG. 2D. Conversely, if the zero crossing is one in which the transition of the input signal is from low to high, circuit 40 provides a short negative going pulse on line 44, as illustrated in FIG. 2E. It should be noted that the transition direction of the input signal is opposite the direction of change of the second derivative signal as the second derivative signal passes through zero.

It is important to make certain that the zero crossing of the second derivative signal reflects an actual transition of the input signal between binary levels, and not a small, but rapid shift in the input signal level. In order to accomplish this, two threshold circuits are provided which must be properly actuated in order for the zero crossing detector 40 to sense and indicate a zero crossing of the second derivative signal. A coincidence gate 46, when receiving gating signals on lines 48 and 50, provides an output on line 52 which permits detector circuit 40 to indicate a zero crossing during a high to low transition of the second derivative signal. This corresponds to a low to high transition of the input signal. Similarly, coincidence gate 54, when receiving gating signals on lines 56 and 58, provides an output on line 60 which permits detector circuit 40 to indicate a zero crossing during a low to high transition of the second derivative signal. This corresponds to a high to low transition of the input signal.

A first threshold means 62 is responsive to the input signal on line 20 for generating first and second gating signals on lines 48 and 56, respectively. The first and second gating signals are generated in dependence upon whether the input signal exceeds or is less than a first threshold level, respectively. The first threshold means 62 includes means for adjusting the first threshold level in dependence upon the level of the analog input signal over a period of time, including resistors 64 and 66, and capacitor 68. Resistors 64 and 66, and capacitor 68 provide a first threshold level input to comparator 70. This threshold level is an attenuated version of the input signal which, due to capacitor 68, does not immediately follow rapid changes in the level of the input signal. When the input signal is above the threshold level, a first gating signal is supplied to line 48, and when the input signal is below the threshold level, a second gating signal is supplied to line 56. Thus, small changes in the input signal, which do not indicate a transition but which do produce a second derivative signal of significant magnitude, do not result in the generation of either a first or a second gating signal. As a consequence, the zero crossing detector 40 is not enabled.

A second threshold means 72 includes a D.C. threshold circuit 74, responsive to the first derivative signal on line 76, a pair of comparators 78 and 80, and an inverter 82. The threshold circuit 74, responsive to the amplitude of the first derivative signal and to the amplitude of the D.C. bias of the photodetector 10 supplied on line 84, provides a second threshold level signal via inverter 82 to comparator 80 and provides a third threshold level signal directly to comparator 78. The comparator 78 provides an output on line 50 when the first derivative signal is less than the third threshold level, while the comparator 80 provides an output on line 58 when the first derivative signal is greater than the second threshold level. Thus, the generation of third and fourth gating signals, supplied to lines 50 and 58, respectively, are produced only when there is a significant change in the first derivative signal. The inverter 82 may provide less than unity gain such that the absolute value of the threshold required for a white to black transition is greater than the absolute value of the threshold required for a black to white transition. This tends to preserve the white margin which precedes a bar code when the bar code is being scanned. As will be apparent, by utilizing two threshold circuits and requiring a significant change in both the input signal and its first derivative in order to sense a transition, the likelihood of an erroneous detection of input signal transition is substantially reduced.

Reference is now made to FIG. 3, which illustrates in greater detail the circuit of the present invention. It should be noted that the coincidence gates 46 and 54 in FIG. 3 are configured as a pair of nodes. The components have been given reference numerals corresponding to those used in FIG. 1. Note that an output from the detector 10 is supplied to the threshold circuit 72 via line 84. This output, bypassing the preamplifier 14, provides a small shift in threshold values as a means for compensating for varying amounts of ambient light affecting the input signal from the detector.

Having described the invention in detail and by reference to preferred embodiments thereof, it will be apparent that modifications and variations are possible without departing from the scope of the invention defined in the appended claims.

What is claimed is:

1. A method for determining the occurrence of transitions in a binary encoded analog input signal, comprising the steps of:
    generating first and second gating signals in dependence upon whether said input signal exceeds or is less than a first threshold level, respectively,
    differentiating said input signal to form a first derivative signal,
    generating third and fourth gating signals in dependence upon whether said first derivative signal exceeds a second threshold level or is less than a third threshold level, respectively,
    differentiating said first derivative signal to form a second derivative signal, said second derivative signal having zero crossings, and
    detecting said zero crossings during the simultaneous generation of said first and third gating signals and during the simultaneous generation of said second and fourth gating signals, thereby determining transitions in said input signal.

2. The method of claim 1 in which the step of generating first and second gating signals includes the step of adjusting said first threshold level in dependence upon the level of said analog input signal over a period of time.

3. The method of claim 1 in which the step of detecting said zero crossings includes the step of gating said second derivative signal through a zero crossing detector circuit upon the simultaneous occurrence of said first and third gating signals or upon the simultaneous occurrence of said second and fourth gating signals.

4. The method of claim 1 in which said first, second, and third threshold levels are D.C. threshold levels.

5. The method of claim 4 in which said second and third threshold levels are of opposite polarity.

6. The method of claim 5 in which said second and third threshold levels are adjusted in dependence upon the level of said input signal over a period of time.

7. The method of claim 6 in which said second and third threshold levels are adjusted in dependence upon the level of said first derivative signal over a period of time.

8. The method of claim 1 further comprising the step of amplifying said input signal prior to differentiating said input signal.

9. The method of claim 8 further comprising the step of filtering said input signal after said input signal is amplified and before said input signal is differentiated.

10. The method of claim 1 in which zero crossings of said second derivative signal during the simultaneous generation of said first and third gating signals indicate low to high transitions of said input signal, and in which zero crossings of said second derivative signal during the simultaneous generation of said second and fourth gating signals indicate high to low transitions of said input signal.

11. A system for determining the occurrence of transitions in a binary encoded analog input signal, comprising:
    first threshold means, responsive to said input signal, for generating first and second gating signals in dependence upon whether said input signal exceeds or is less than a first threshold level, respectively, first circuit means, responsive to said input signal, for differentiating said input signal to form a first derivative signal, second threshold means, responsive to said first derivative signal, for generating third and fourth gating signals in dependence upon whether said first derivative signal exceeds a second threshold level or is less than a third threshold level, respectively, second circuit means, responsive to said first derivative signal, for differentiating said first derivative signal to form a second derivative signal, said second derivative signal having zero crossings, and zero crossing means, responsive to said second derivative signal and to said first, second, third and fourth gating signals, for detecting said zero crossings of said second derivative signal during the simultaneous receipt of said first and third gating signals and during the simultaneous receipt of said second and fourth gating signals, thereby determining transitions in said input signal.

12. The system of claim 11 in which said first threshold means includes means for adjusting said first threshold level in dependence upon the level of said analog input signal over a period of time.

13. The system of claim 11 in which said zero crossing means includes a zero crossing detector circuit, a first coincidence gate for enabling said detector circuit upon the simultaneous occurrence of said first and third gating signals, and a second coincidence gate for enabling said detector circuit upon the simultaneous occurrence of said second and fourth gating signals.

14. The system of claim 11 in which said first, second, and third threshold levels are D.C. threshold levels.

15. The system of claim 14 in which said second and third threshold levels are of opposite polarity.

16. The system of claim 15 in which said second threshold means is responsive to said input signal such that said second and third threshold levels are adjusted in dependence upon the level of said input signal over a period of time.

17. The system of claim 16 in which said second threshold means is responsive to said first derivative signal such that said second and third threshold levels are adjusted in dependence upon the level of said first derivative signal over a period of time.

18. The system of claim 11 further comprising preamplifier means for amplifying said input signal.

19. The system of claim 18 further comprising low pass filter means, responsive to said preamplifier means, for filtering said input signal after said input signal is amplified and before said input signal is differentiated.

20. The system of claim 11 in which zero crossings of said second derivative signal during the simultaneous generation of said first and third gating signals indicate low to high transitions of said input signal, and in which zero crossings of said second derivative signal during the simultaneous generation of said second and fourth gating signals indicate high to low transitions of said input signal.

* * * * *